(12) United States Patent
McGuire et al.

(10) Patent No.: US 9,541,597 B2
(45) Date of Patent: Jan. 10, 2017

(54) DIAGNOSTIC TESTING OF AN ELECTRIC METER SOCKET

(75) Inventors: Drew Benton McGuire, Birmingham, AL (US); Chad Alan McMicken, Birmingham, AL (US)

(73) Assignee: SOUTHERN COMPANY SERVICES, INC., Atlanta, GA (US)

( * ) Notice: Subject to any disclaimer, the term of this patent is extended or adjusted under 35 U.S.C. 154(b) by 1199 days.

(21) Appl. No.: 13/561,394

(22) Filed: Jul. 30, 2012

(65) Prior Publication Data

US 2014/0028323 A1 Jan. 30, 2014

(51) Int. Cl.
| G01R 1/04 | (2006.01) |
| G08B 21/00 | (2006.01) |
| G01R 31/04 | (2006.01) |
| G01R 11/04 | (2006.01) |
| G01R 35/04 | (2006.01) |

(52) U.S. Cl.
CPC .............. *G01R 31/04* (2013.01); *G01R 11/04* (2013.01); *G01R 35/04* (2013.01)

(58) Field of Classification Search
CPC . G01R 19/0092; G01R 19/00; G01R 19/0084; G01R 19/165; G01R 31/3651; G01R 31/3679; G01R 31/3606; G01R 31/021; G01R 31/025; G01R 31/026; G01R 31/04; G08B 21/18; G08B 21/182; G08B 13/22

USPC ............ 324/74, 556, 133, 51, 66, 508, 142, 96,324/157, 158.1, 76.11, 99 D, 525, 710; 340/635, 340/637, 641, 642, 652, 56; 702/61–65

See application file for complete search history.

(56) References Cited

U.S. PATENT DOCUMENTS

| 5,361,026 A * | 11/1994 | Pruehs ................... G01R 35/00 324/133 |
| 2007/0055889 A1* | 3/2007 | Henneberry ....... G01R 19/2513 713/186 |
| 2010/0036624 A1* | 2/2010 | Martin ................... G01R 22/10 702/61 |

\* cited by examiner

*Primary Examiner* — Patrick Assouad
*Assistant Examiner* — Taqi Nasir
(74) *Attorney, Agent, or Firm* — Thomas|Horstemeyer, LLP

(57) ABSTRACT

An embodiment of an electric meter socket testing system features a plurality of tester line terminals adapted to connect with line terminals of an electric meter socket; a plurality of tester load terminals adapted to connect with load terminals of the electric meter socket; and a test module adapted to control input of voltage from the line terminals to the load terminals; and an indication interface configured to output whether the electric meter socket is determined to be safe for connecting an electric meter. Accordingly, the test module may further be adapted to check for a short circuit in an electrical distribution wiring network coupled to the line terminals in at least one diagnostic procedure.

20 Claims, 6 Drawing Sheets

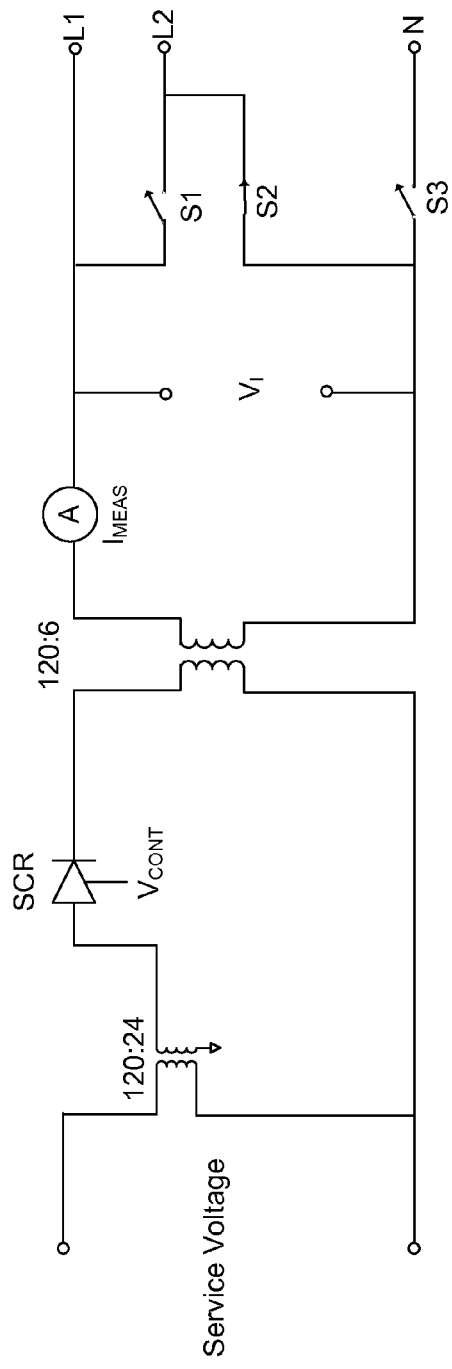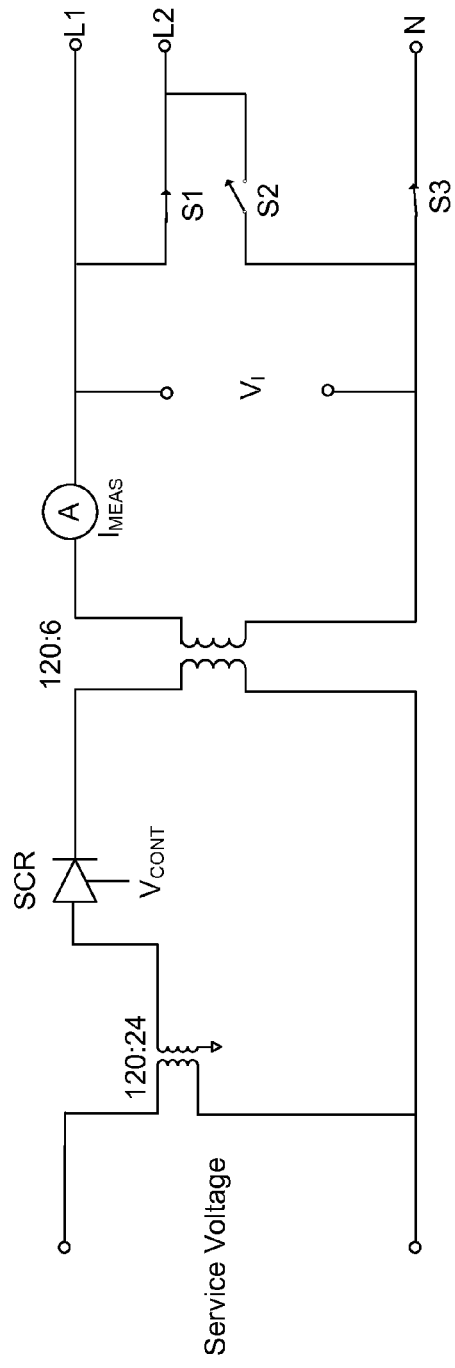
FIG. 4
FIG. 5

DIAGNOSTIC TESTING OF AN ELECTRIC METER SOCKET

TECHNICAL FIELD

The present disclosure is generally related to diagnostic evaluation of electric meter sockets.

BACKGROUND

Electric meters, such as watt-hour meters, are commonly used in the electric utility industry, where they are generally utilized to measure the amount of electrical power used at a residential or commercial building location. To secure the electric meter, a meter box or cabinet is generally mounted outside the building, such as on one of the sidewalls of the building. The meter box often contains a meter socket in which the electric meter plugs into during use. The meter socket comprises line terminals that connect to the electric power line conductors extending from a utility power source and load terminals that connect to the residential or commercial building consuming the incoming line power.

In one common design, the line and load terminals of the meter socket are designed to receive blade terminals extending outward from the base of the electric meter. Once plugged into the meter socket, the electric meter completes an electric circuit between the line and load terminals of the meter socket. As electricity is transferred from the line terminals to the load terminals (e.g., from the utility line power source to the building), the electric meter measures the amount of electricity provided.

Typically, when electrical service to a particular site or building is desired to be disconnected, a utility service person is dispatched to the particular building and removes the electric meter. To reconnect the electrical service, the same or another service person must be sent out to reinstall the electric meter. However, circumstances, such as theft and vandalism, may cause electrical circuitry of the building to become unsafe before the electric meter is reconnected. Thus, the service person reconnecting the electric meter may be in danger in reconnecting the meter unless the hazardous condition is identified.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 4-5 are schematic diagrams of an embodiment of a test module in accordance with the present disclosure.

DETAILED DESCRIPTION

It will be readily apparent that the components of embodiments of the present disclosure, as generally described and illustrated in the figures, could be arranged and designed in a wide variety of different configurations. Thus, the following detailed description of exemplary embodiments of a utility meter socket testing device for testing a condition of an electric watt hour meter socket is not intended to limit the scope of the disclosure as claimed, but is merely representative of exemplary embodiments.

Figure 1:
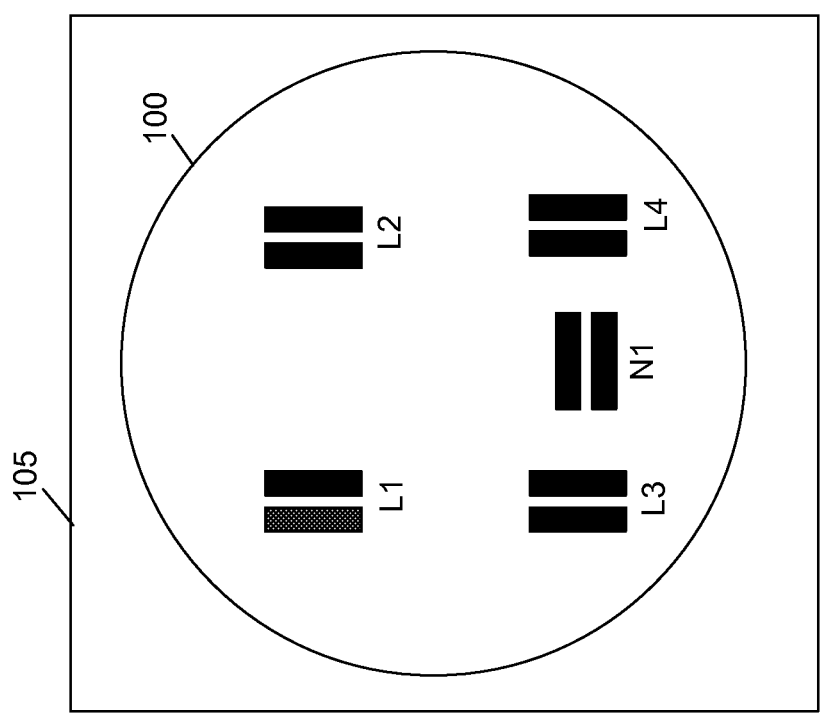
FIG. 1 is a diagram of an electric watt-hour meter socket in accordance with the present disclosure.

In an electrical power distribution system, a power source may provide electrical power service to a residential or commercial building site (not shown) over two incoming line conductors. Referring to FIG. 1, a diagram of an electric watt-hour meter socket 100 is illustrated. As illustrated in FIG. 1, line conductors bringing in the electric current from the power source (e.g., a utility company) are connected to an electric watt-hour meter socket 100 via line terminals L1, L2 (e.g., female line jaw contacts). The meter socket 100 is typically housed in a rectangular shaped housing or box 105 attached to a side of the building.

In addition, meter socket load terminals L3, L4 (e.g., female line jaw contacts) are connected to load wires (e.g., customer wires) providing received electricity to the customer of the building site. Accordingly, load terminals L3, L4 are attached to the electrical distribution wiring network of the building site. Each load terminal channels single phase service (e.g. 110 volts) to the electrical distribution wiring network, and can also provide two phase service (e.g., 220 volts).

As shown in the figures, line terminals L1, L2 are positioned above load terminals L3, L4. Also, a neutral line conductor extends from the power source to the meter socket 100 and is connected to the meter socket 100 via neutral terminal N1 positioned between the line terminals L1, L2 and the load terminals L3, L4, in one possible configuration. Terminal positions within the meter socket may be modified in different embodiments in accordance with the present disclosure.

Typically, a meter socket 100 is mounted to the outer wall of the building site. In order to measure the electrical power consumed by the building site, a watt-hour meter is removably attached to meter socket 100. Accordingly, FIG. 2 depicts front and back views of a watt-hour meter 200 that may be connected to the meter socket 100.

Figure 2:
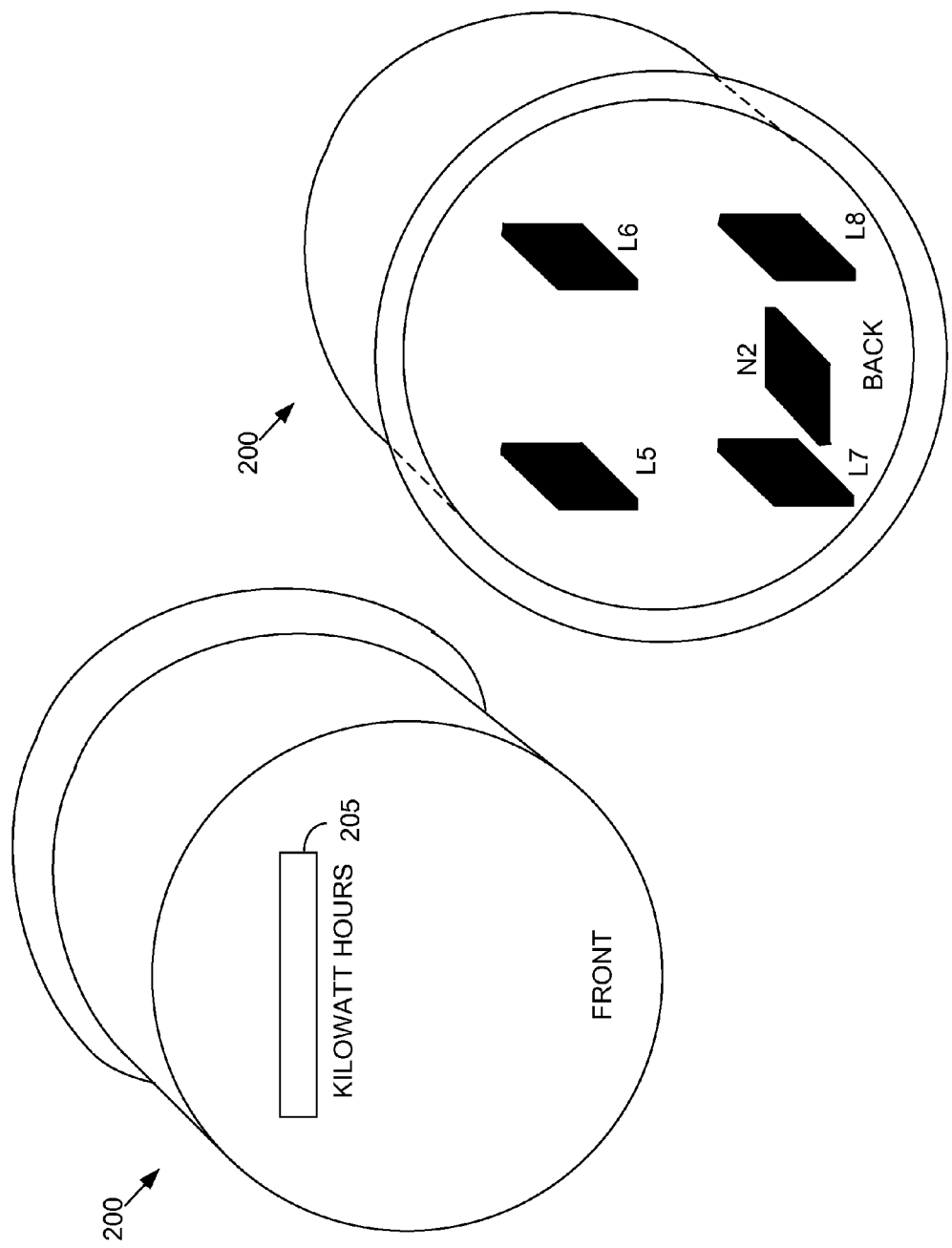
FIG. 2 is a diagram of an electric watt-hour meter in accordance with the present disclosure.

In FIG. 2, a back-view of one embodiment of a watt-hour meter 200 includes meter line contacts L5, L6 (e.g., male blade line contacts) and meter load contacts L7, L8 (e.g., male blade load contacts) adapted to engage the meter socket line terminals L1, L2 and meter socket load terminals L3, L4, respectively. The meter 200 also includes a neutral contact N2 (e.g., male neutral blade contact) adapted to contact or engage the neutral line terminal N1. In one possible design, each of these blade contacts are configured for being removably engaged to the jaw contacts of the meter socket 100. Other embodiments and arrangements may have different contact types and/or may not include a neutral contact connection at the meter 200.

When the meter 200 and meter socket 100 are connected together, an electrical circuit is completed so that electrical energy can pass from the line contacts L5, L6 to the load contacts L7, L8 for distribution to the building site. As electric current flows from the meter line terminals L1, L2 to the meter load terminals L3, L4, the meter 200 records the wattage provided to the customer service. The measure of wattage provided to the customer is subsequently used for charging the customer for service of electricity. Accordingly, a meter display 205 on the front of the meter indicates the current wattage recorded by the meter 200.

As discussed, the electric meter 200 will occasionally need to be removed from the meter socket 100 of a building site. Afterwards, the electrical distribution wiring circumstances may be altered, such as by theft and vandalism, causing electrical circuitry of the building to become unsafe before the electric meter is reconnected. For example, often residences and commercial buildings are vandalized by unscrupulous persons in attempts to strip copper wiring from these locations, where the removal of the copper wiring may now cause the wiring network to become potentially hazardous unbeknownst to the service person tasked to reinstall the electric meter.

Accordingly, installation of the electric meter 200 could result in a flash, explosion, fire, etc. due to direct application of 240 volts to an unknown circuit that may have a fault due to modifications made to the wiring network. Therefore, a meter socket testing device that can identify such faults before reconnecting the electric meter is beneficial.

Figure 3:
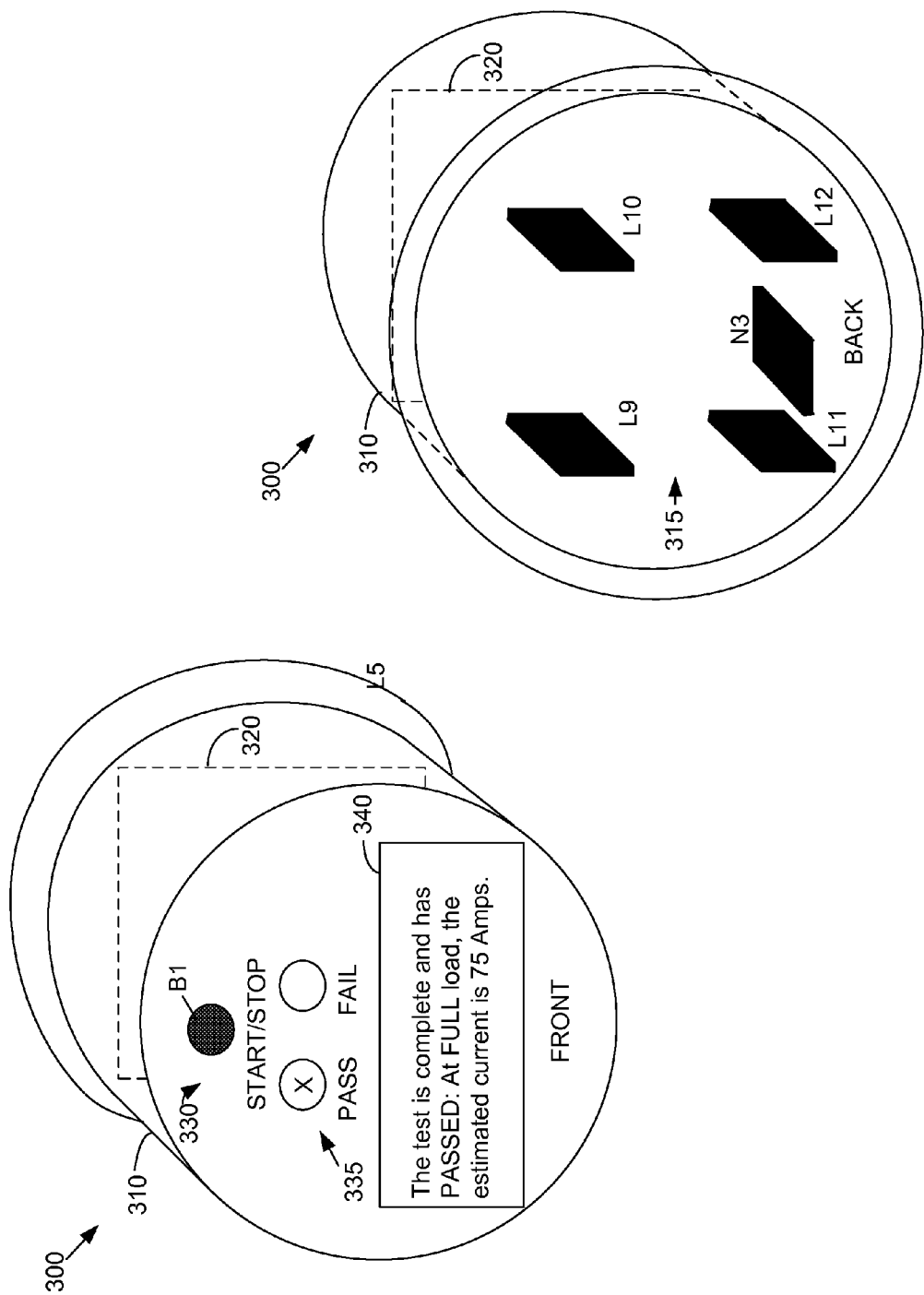
FIG. 3 is a diagram of an embodiment of a meter socket testing device in accordance with the present disclosure.

Referring now to FIG. 3, one embodiment of a utility meter socket testing device 300 comprises a housing 310, a connection system 315 adapted to engage and connect with the meter socket 100, a test module 320 adapted to interface with the meter socket 100, and an indication interface 330 adapted to indicate load characteristics of the electrical distribution wiring network of a residence or commercial building site. The test module 320 and the indication interface 330 are containable or partially containable within the housing 310.

The meter socket testing device 300 provides fast, accurate readings for service personnel to determine the state of an electrical distribution wiring network of the building site. An embodiment of the meter socket testing device has the same form factor as an electric meter 200, making it convenient for service personnel to use. On embodiment of the meter socket testing device is able to accurately and repeatedly distinguish between open circuits, applied loads, and short circuits.

More specifically, the connection system 315 is adapted to engage the meter socket line terminals L1, L2 and meter socket load terminals L3, L4 of the meter socket 100 (FIG. 1). Accordingly, tester line terminals L9, L10 and tester load terminals L11, L12 permit the meter socket testing device 300 to plug into the female terminals (e.g., meter socket line terminals L1, L2 and meter socket load terminals L3, L4) of the meter socket 100 with respective contacts. The meter testing device 300 also includes a neutral contact N3 adapted to engage the neutral line terminal N1 of the meter socket 100. In one embodiment, blade contacts L9-L12, N3 are configured for being removably engaged to the jaw contacts of the meter socket 100.

When the meter testing device 300 and meter socket 100 are connected together, an electrical circuit is completed so that electrical energy can pass from the tester line terminals L9, L10, though the test module 320, to the load terminals L11, L12 for distribution to the building site. As electric current flows or passes from the tester line terminals L9, L10 to the tester load terminals L11, L12, one embodiment of the test module 320 of the meter socket testing device 300 identifies the load characteristics of the electrical distribution wiring network of the building site, including distinguishing between open circuits, acceptable applied loads, and short circuits.

Before installing the electrical meter 200 in a meter socket 100, the meter socket testing device 300 may be installed in the socket 100 and activated (e.g., selecting a button B1 on the front interface of the device) which initiates a diagnostic testing procedure to be performed on the electrical distribution wiring network. After completion of the diagnostic testing procedure, the test module 320 may signal to an indication interface 330 of the meter socket testing device 300 and the indication interface 330 may then provide an indication of characteristics of the load that is connected. The test module 320 may distinguish the load from a short circuit and an applied load at the building site (e.g., an oven that has been left on, a hair dryer that's been left on, a light bulb that is on, etc.) or an open circuit. Additionally, embodiments of the meter socket testing device 300 may also indicate a safety level of the electrical distribution wiring network.

Referring to FIG. 3, one embodiment of the indication interface 330, in addition to including a button B1 that can be used to activate operation of the meter socket testing device 300, also includes a plurality of indicator displays 335 (e.g., LEDs) that can indicate a safety level for the connected wiring network. In one embodiment, after diagnostic testing is completed, a single indicator display may be activated to indicate a passing or "green light" condition that signifies that the device 300 has determined that an electrical meter 200 may be safely connected to the meter socket 100. Alternatively, a different single indicator display may be activated to indicate a failing or "red light" condition that signifies that the device 300 has determined that an electrical meter 200 may not be safely connected to the meter socket 100.

In addition, the indication interface 330 may also contain a display screen 340 (e.g., LCD display) that can display additional information to a service person. In one embodiment, an expected level of current that is expected to be flowing through the meter 200 after being connected is displayed. Therefore, the service person may use this information to also determine whether he or she thinks it is safe to connect the electrical meter 200 to the meter socket 100. Further, in some embodiments, the display screen presents status information, as diagnostic procedures are running, that provides information on what test is currently being run or an indication of the progress of the testing. Further, in addition to providing a fail indication, in one embodiment, the display screen 340 provides an indication as to a reason for the failed result, such as indicating a Line to Line fault or Line to Neutral fault.

To perform the diagnostic testing procedure, the test module 320 pulls power from the hot side (the utility side) of the meter socket 100 and ramps up the input voltage to a set level (e.g., 10 volts over a set period (e.g., less than 90 seconds) that is small compared to the full service voltage (e.g., 240 volts). The test module 100 measures the current at the load-side of the electrical distribution wiring network and computes the impedance of the electrical distribution wiring network at the building site. Based on the calculated impedance, the wiring network may be identified as containing a short circuit, open circuit, or being "normal." As an example, a calculated impedance that is below a first defined value may indicate a short circuit. Further, a calculated impedance that is above a second defined value may indicate an open circuit, whereas a calculated impedance that is above the first defined value and below the second defined below value may indicate that impedance of the wiring network is normal and passes inspection. Values used for the first and second defined values may be configurable and adjustable for different needs and/or environments. Additionally, from the calculated impedance, the current that would be flowing through a connected electrical meter under full voltage may be computed and presented by the indication interface 330.

In supplying the voltage, the test module 320 ramps voltage up from zero while monitoring the output voltage and current (e.g., results can be determined with less than 10 volts). When voltage or current reaches a predefined limit, voltage is removed from the test module 320 and electrical distribution wiring network of the building site.

In one embodiment, a series of switches operate to test both conductor lines and neutral for faults. The meter socket testing device 300 calculates the impedance of the electrical distribution wiring network or circuit and the expected current that would flow if full voltage was applied to the circuit. As discussed, a pass/fail result is displayed to the user based on the test module 320 accurately distinguishing between an open circuit, a loaded circuit, and a short circuit. Advantageously, the meter socket testing device 300 does not apply a full voltage to an unknown customer circuit in determining whether or not the electrical distribution wiring network is hazardous.

Referring to FIGS. 4 and 5, one embodiment of circuitry utilized in the test module 320 is depicted for a first configuration. As previously described, the test module 320 is connected to the line terminals L1, L2 and the load terminals L3, L4 of the meter socket 100, along with the neutral terminal N1. Service voltage (240 VAC) provided from the power source or utility company is ramped up via transformers and SCR (silicon controlled rectifier) to run a couple of separate tests to check if there is a short circuit from one of the line conductors to the neutral line conductor and to check if there is a short circuit between the two line conductors. Embodiments of the test module circuitry are not limited to the particular transformer ratios (e.g., 120:24, 120:6) demonstrated in the figure and may be different in different embodiments.

One embodiment of the test module 100 utilizes switching mechanisms to reconfigure the testing system for the two tests. In the same test, short circuits between the each of the line conductors and the neutral line conductor may be checked. As shown in FIG. 5, by closing switches S1 and S3, the line conductor terminals L3, L4 are shorted and switch S2 is open so there should not be a short present between neutral line conductor and the line conductors under normal operations. However, if the test module 320 measures a current $I_{MEAS}$ via an inline ammeter A, then this may indicate a short circuit although the switch S2 is open (after computing the impedance load corresponding to the measured current). It is noted that ramping of the input voltage may be prematurely discontinued, such as in a situation where the measured current level reaches a predefined current level before the voltage reaches its predefined voltage level. Under this situation, the test module 320 may signal a failure status for installing the electric meter.

After completing testing between the two line conductors and the neutral line conductor, one embodiment of the test module 320 resets and reconfigures the switches S1, S2, S3 to opposite positions, as demonstrated in FIG. 4. Therefore, in the first test, if switch S1 is closed, switch S2 is open, and switch S3 is closed, then for the second test, switch S1 is open, switch S2 is closed, and switch S3 is open. In the second test, presence of a short circuit between the line conductors is diagnostically tested by ramping the input voltage $V_I$ from zero to the set voltage level via a microcontroller controlling the gate voltage ($V_{CONT}$) of the SCR. It is noted that ramping of the input voltage may be prematurely discontinued such as in a situation where the measured current level reaches a predefined current level before the voltage reaches its predefined voltage level. Under this situation, the test module 320 may signal a failure status for installing the electric meter.

As discussed above, an impedance load may be determined from the measured current $I_{MEAS}$ and input voltage $V_I$. Based on the determined impedance, the wiring network may be identified as containing a short circuit, open circuit, or being "normal" after performing comparisons of a calculated impedance with defined threshold values.

As shown in FIG. 4, by opening switches S1 and S3, the line conductor terminals L3, L4 are not shorted within the testing system circuitry and switch S2 is closed so there should not be a short present between the line conductor L3 and the line conductor L4 under normal operation. However, if the test module 320 measures a current $I_{MEAS}$ via an inline ammeter A, then this may indicate that a short circuit is present between the line conductors although the switch S2 is open (after computing the impedance load corresponding to the measured current). Alternatively, if the test module 320 does not measure a current $I_{MEAS}$ above a defined current threshold value and computes a corresponding impedance level above a defined impedance threshold value, then an open circuit may be determined to be present.

Since the installation of a residential electric meter results in the direct application of 240 volts to an unknown circuit, the meter socket testing device 300 can test load characteristics of an unknown circuit and avoid potential hazardous results, such as in the case of a short circuit, where the direct application of full voltage can result in meter blow-outs, fires, flashes, etc.

As discussed, one embodiment of the test module 320 calculates the impedance load of the electrical distribution wiring network from the voltage and current measurements. From the magnitude of the impedance, the test module 320 determines whether the load is viable for safely installing the meter 200. To do so, the test module 320 can estimate the current that would be passing through an electric meter 200 under full voltage and provide this information to the service person or operator by the indication interface 330, in addition to indicating whether the estimated current passes inspection or fails inspection with respect to safely being able to install an electric meter 200. An estimated or expected current may be computed for various loads including 120 volts, 240 volts, etc.

In some embodiments, the estimated or expected current value may be used as the basis for identifying a current condition of the electrical distribution wiring network of the building site. Accordingly, if the estimated current value is greater than a first defined value, then a short circuit may be identified. If the estimated current value is lower than a second defined value, then an open circuit may be identified. Otherwise, if the estimated current value falls in between the first defined value and the second defined value, then a "normal" or acceptable applied load is identified, where the first and second defined values are configurable.

Setting of the defined or threshold value(s) may depend on a particular situation or a desired level of caution. For example, 100 amps may be set as the first defined value which may not necessarily indicate a real short circuit but may still indicate a potentially unsafe electrical distribution wiring system. In a different environment or circumstance, a higher threshold value, such as 200 amps, may be set, since most residential homes utilize a 200 amp service. Accordingly, industrial buildings or commercial businesses may utilize different threshold settings and may be configured accordingly.

Embodiments of the test module 320 are not limited to the circuit design of FIGS. 4-5. Components of the test module 320 are arranged and designed in a wide variety of different configurations in various embodiments. Accordingly, FIGS. 4-5 are merely representative of exemplary embodiments. Other embodiments utilize a variable transformer or a variety of electronic switches, including MOSFETs, amplifiers, etc. to control the voltage levels applied by the test module 320, as opposed to or in addition to step-down transformers and SCRs depicted.

Figure 6:
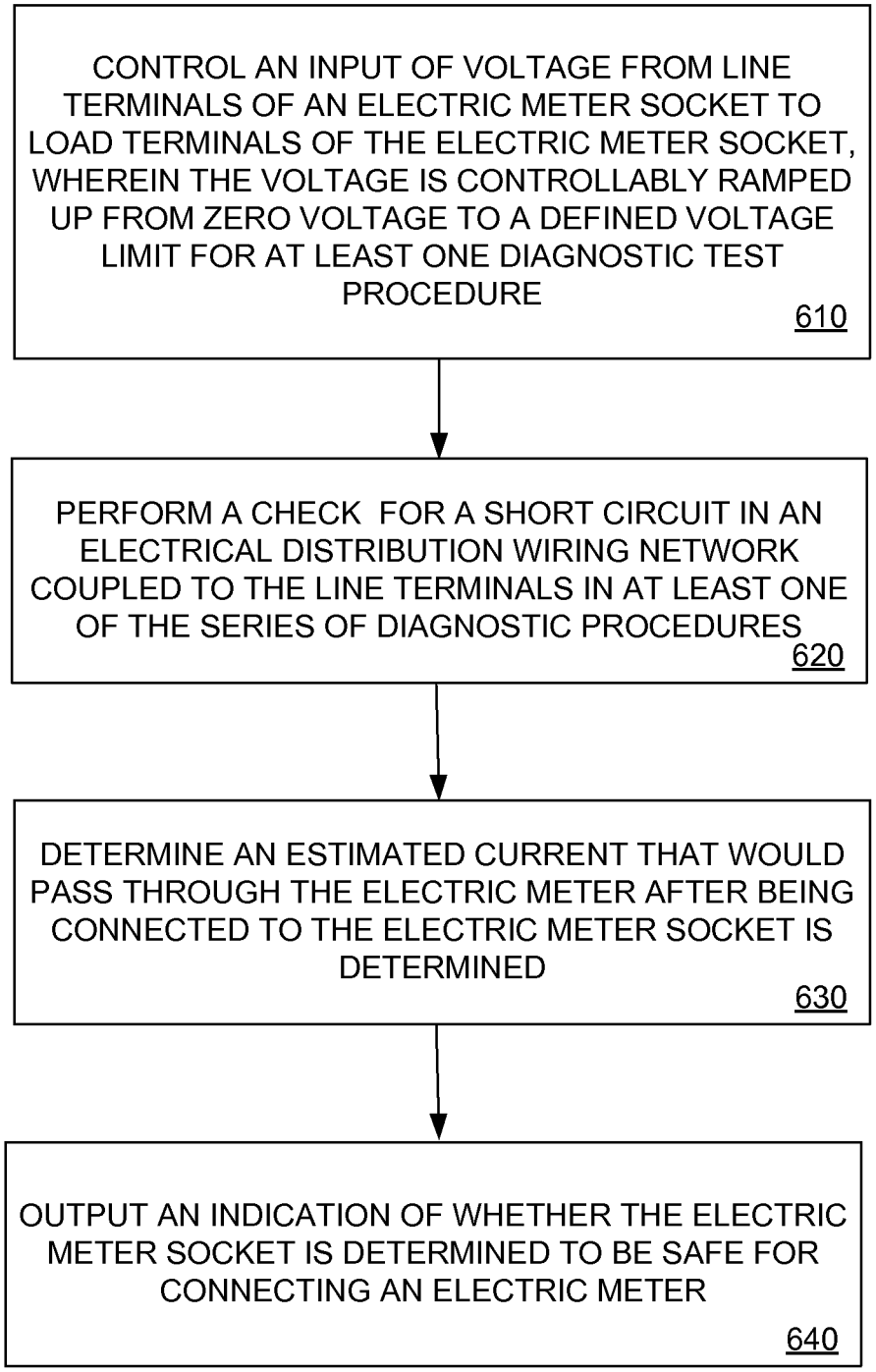
FIG. 6 is a diagram of a flowchart describing an embodiment of an electric meter socket testing method in accordance with the present disclosure.

With reference to FIG. 6, shown is a flowchart diagram of an embodiment of an electric meter socket testing method in accordance with the present disclosure. To begin, an input of voltage is controlled (610) (e.g., by a microprocessor of a test module 320) from line terminals of an electric meter socket 100 to load terminals of the electric meter socket 100, wherein the voltage is controllably ramped up from zero voltage to a defined voltage limit for at least one diagnostic test procedure. Then, a check is performed (620) for a short circuit in an electrical distribution wiring network coupled to the line terminals in at least one of the series of diagnostic procedures. Further, an estimated current that would pass through the electric meter socket after being connected to the electric meter socket is determined (630) and an output is made (640) indicating whether the electric meter socket is determined to be safe for connecting an electric meter.

Figure 7:
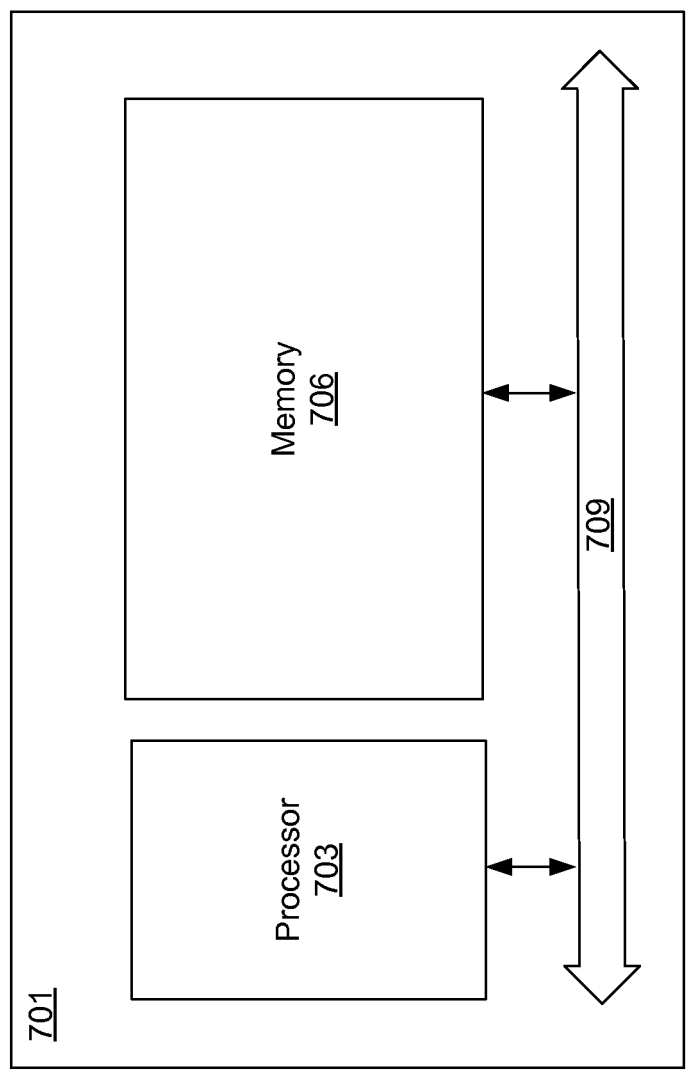
FIG. 7 is a block diagram of a computing device that may implement functionalities of embodiments of the meter socket testing device in accordance with the present disclosure.

With reference to FIG. 7, shown is a schematic block diagram of a computing device 701 that may implement the test module 320, the indication interface 330, and/or control input voltage provided to the test module 320 according to an embodiment of the present disclosure. The computing device 701 (e.g., microcontroller of the test module 320) includes at least one processor circuit, for example, having a processor 703 and a memory 706, both of which are coupled to a local interface 709. The local interface 709 may comprise, for example, a data bus with an accompanying address/control bus or other bus structure as can be appreciated.

Stored in the memory 706 are both data and several components that are executable by the processor 703. In particular, stored in the memory 706 and executable by the processor 703 are diagnostic testing procedures, indication or display instructions, and/or other instructions or code. It is understood that there may be other applications that are stored in the memory 706 and are executable by the processor 703 as can be appreciated. Where any component discussed herein is implemented in the form of software, any one of a number of programming languages may be employed such as, for example, C, C++, C#, Objective C, Java, Javascript, Perl, PHP, Visual Basic, Python, Ruby, Delphi, Flash, Standard Query Language (SQL) or any other programming or scripting languages.

A number of software components are stored in the memory 706 and are executable by the processor 703. In this respect, the term "executable" means a program file that is in a form that can ultimately be run by the processor 703. Examples of executable programs may be, for example, a compiled program that can be translated into machine code in a format that can be loaded into a random access portion of the memory 706 and run by the processor 703, source code that may be expressed in proper format such as object code that is capable of being loaded into a random access portion of the memory 706 and executed by the processor 703, or source code that may be interpreted by another executable program to generate instructions in a random access portion of the memory 706 to be executed by the processor 703, etc.

The memory 706 is defined herein as including both volatile and nonvolatile memory and data storage components. Volatile components are those that do not retain data values upon loss of power. Nonvolatile components are those that retain data upon a loss of power. Thus, the memory 706 may comprise, for example, random access memory (RAM), read-only memory (ROM), static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 703 may represent multiple processors 703 and the memory 706 may represent multiple memories 706 that operate in parallel processing circuits, respectively. In such a case, the local interface 709 may be an appropriate network that facilitates communication between any two of the multiple processors 703, between any processor 703 and any of the memories 706, or between any two of the memories 706, etc.

Although functionalities of the test module 320, the indication interface 330, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

Any process descriptions or blocks in flowchart(s) should be understood as representing modules, segments, or portions of code which include one or more executable instructions or code for implementing specific logical functions or steps in the process, and alternate implementations are included within the scope of the embodiments n which functions may be executed out of order from that shown or discussed, including substantially concurrently or in reverse order, depending on the functionality involved, as would be understood by those reasonably skilled in the art.

Functionalities of the test module 320, the indication interface 330, and other various systems described herein may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, or transport the program for use by or in connection with the instruction execution system, apparatus, or device. The computer readable medium can be, for example but not limited to, an electronic, magnetic, optical, electromagnetic, infrared, or semiconductor system, apparatus, or device medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). In addition, the scope of the certain embodiments includes embodying the functionality of embodiments of the present disclosure in logic embodied in hardware or software-configured mediums.

It should be emphasized that the above-described embodiments are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, having thus described various embodiments, at least the following is claimed:

1. An electric meter socket testing system comprising:
   a plurality of tester line terminals adapted to connect with line terminals of an electric meter socket;
   a plurality of tester load terminals adapted to connect with load terminals of the electric meter socket;
   a test module comprising a switching mechanism having a plurality of test switches, wherein the test module is adapted to control input of voltage from the line terminals to the load terminals, wherein the voltage is controllably ramped up from zero voltage to a defined voltage limit for at least one diagnostic test procedure;
   wherein the test module is adapted to check for one or more short circuits in an electrical distribution wiring network coupled to the line terminals in said at least one diagnostic procedure, wherein the switching mechanism of the test module is adapted to configure an arrangement of the plurality of test switches that tests for presence of a short circuit between a neutral line conductor and a line conductor in the electrical distribution wiring network, wherein the switching mechanism of the test module is further adapted to reconfigure the arrangement of the plurality of test switches and test for presence of a short circuit between a pair of line conductors in the electrical distribution wiring network; and
   an indication interface configured to output whether the electric meter socket is determined to be safe for connecting an electric meter based at least in part on the at least one diagnostic test procedure.

2. The system of claim 1, wherein said at least one diagnostic procedure computes an estimated current that should pass through the electric meter after being connected to the electric meter socket and compares the estimated current with a measured current that is passing through the electric meter during the at least one diagnostic procedure.

3. The system of claim 1, wherein the defined voltage limit does not exceed 10 volts.

4. The system of claim 1, wherein the indication interface is further configured to display a failed result after determining that it is not safe to connect the electric meter, wherein for a positive test for one or more short circuits in the electrical distribution wiring network, the failed result comprises an indication that the presence of the short circuit between the neutral line conductor and the line conductor has been detected or that the presence of the short circuit between the pair of line conductors has been detected.

5. The system of claim 1, wherein the indication interface comprises a display screen.

6. The system of claim 1, wherein the test module is adapted to measure current at a load-side of the electrical distribution wiring network and compute an impedance of the electrical distribution wiring network, wherein based on the computed impedance, the wiring network may be identified as containing a short circuit, an open circuit, or being at an acceptable impedance level.

7. The system of claim 1, wherein ramping of the voltage from the line terminals to the load terminals is discontinued before the defined voltage limit is reached when a measured current at a load-side of the electrical distribution wiring network exceeds a defined current threshold value.

8. The system of claim 7, wherein said at least one diagnostic test procedure comprises a first test procedure to check for the short circuit from the line conductor to the neutral line conductor, a second test procedure to check for the short circuit between the pair of line conductors, and a third test procedure to check for an open circuit in the electrical distribution wiring network.

9. The system of claim 8, wherein the voltage is reset to zero after completion of the first test procedure and before initiation of the second test procedure.

10. An electric meter socket testing method comprising:
    controlling input of voltage from line terminals of an electric meter socket to load terminals of the electric meter socket, wherein the voltage is controllably ramped up from zero voltage to a defined voltage limit for at least one diagnostic test procedure;
    checking for at least one short circuit in an electrical distribution wiring network coupled to the line terminals in said at least one diagnostic procedure by:
      configuring an arrangement of a plurality of test switches that tests for presence of a short circuit between a neutral line conductor and a line conductor in the electrical distribution wiring network, and
      reconfiguring the arrangement of the plurality of test switches and testing for presence of a short circuit between a pair of line conductors in the electrical distribution wiring network;
    determining an estimated current that should pass through the electric meter after being connected to the electric meter socket and comparing the estimated current with a measured current that is passing through the electric meter during the at least one diagnostic procedure; and
    outputting whether the electric meter socket is determined to be safe for connecting an electric meter based on the comparing operation.

11. The method of claim 10, wherein the defined voltage limit does not exceed 10 volts.

12. The method of claim 10, further comprising displaying a failed result after determining that it is not safe to connect the electric meter and further displaying an indication as to a reason for the failed result, the failed result comprising an indication that the presence of the short circuit between the neutral line conductor and the line conductor has been detected or an indication that the presence of the short circuit between the pair of line conductors has been detected.

13. The method of claim 10, further comprising measuring the current at a load-side of the electrical distribution wiring network and computing an impedance of the electrical distribution wiring network, wherein based on the computed impedance, the wiring network may be identified as containing a short circuit, open circuit, or being at an acceptable impedance level.

14. The method of claim 10, wherein ramping of the voltage from the line terminals to the load terminals is discontinued before the defined voltage limit is reached when a measured current at a load-side of the electrical distribution wiring network exceeds a defined current threshold value.

15. The method of claim 10, wherein said at least one diagnostic test procedure comprises a first test procedure to check for the short circuit from the line conductor to the neutral line conductor, a second test procedure to check for the short circuit between the pair of line conductors, and a third test procedure to check for an open circuit in the electrical distribution wiring network.

16. The method of claim 15, wherein the voltage is reset to zero after completion of the first test procedure and before initiation of the second test procedure.

17. A non-transitory computer readable medium storing instructions executable by a processor comprising:
   code that controls input of voltage from line terminals of an electric meter socket to load terminals of the electric meter socket, wherein the voltage is controllably ramped up from zero voltage to a defined voltage limit for at least one diagnostic test procedure;
   code that checks for a short circuit in an electrical distribution wiring network coupled to the line terminals in said at least one of diagnostic procedure by:
      enabling an arrangement of a plurality of test switches that tests for presence of a short circuit between a neutral line conductor and a line conductor in the electrical distribution wiring network, and
      enabling a reconfiguration of the arrangement of the plurality of test switches that tests for presence of a short circuit between a pair of line conductors in the electrical distribution wiring network;
   code that determines an estimated current that should pass through the electric meter after being connected to the electric meter socket and comparing the estimated current with a measured current that is passing through the electric meter during the at least one diagnostic procedure; and
   code that outputs whether the electric meter socket is determined to be safe for connecting an electric meter based on the comparing step.

18. The medium of claim 17, further comprising code that displays a failed result after determining that it is not safe to connect the electric meter and further displaying an indication as to a reason for the failed result, the failed result comprising an indication that the presence of the short circuit between the neutral line conductor and the line conductor has been detected or that the presence of the short circuit between the pair of line conductors has been detected.

19. The medium of claim 17, further comprising code that measures a current at a load-side of the electrical distribution wiring network and computes an impedance of the electrical distribution wiring network, wherein based on the computed impedance, the wiring network may be identified as containing the short circuit, an open circuit, or being at an acceptable impedance level.

20. The medium of claim 17, wherein said at least one diagnostic test procedure comprises a first test procedure to check for the short circuit from the line conductor to the neutral line conductor, a second test procedure to check for the short circuit between the pair of line conductors, and a third test procedure to check for an open circuit in the electrical distribution wiring network.

* * * * *